(12) United States Patent
Zhu et al.

(10) Patent No.: US 7,944,314 B2
(45) Date of Patent: May 17, 2011

(54) LOW FREQUENCY OSCILLATOR FOR BURST-MODE DIMMING CONTROL FOR CCFL DRIVER SYSTEM

(75) Inventors: Liqiang Zhu, Shanghai (CN); Lieyi Fang, Shanghai (CN)

(73) Assignee: On-Bright Electronics (Shanghai) Co., Ltd., Zhangjiang Hi Tech Park, Shanghai (CN)

( * ) Notice: Subject to any disclaimer, the term of this patent is extended or adjusted under 35 U.S.C. 154(b) by 56 days.

(21) Appl. No.: 12/537,964

(22) Filed: Aug. 7, 2009

(65) Prior Publication Data
US 2010/0315148 A1  Dec. 16, 2010

(30) Foreign Application Priority Data
Jun. 12, 2009  (CN) .......................... 2009 1 0053079

(51) Int. Cl.
*H03L 7/00* (2006.01)
(52) U.S. Cl. ............ 331/34; 331/16; 327/291; 315/307; 315/324
(58) Field of Classification Search ............. 331/16, 331/34; 327/291; 315/307, 224
See application file for complete search history.

(56) References Cited

U.S. PATENT DOCUMENTS
6,445,143 B1 * 9/2002 Min .............................. 315/307
* cited by examiner

*Primary Examiner* — Arnold Kinkead
(74) *Attorney, Agent, or Firm* — Jones Day (57) ABSTRACT

Oscillator system and method thereof. The oscillator system includes a first voltage-to-current converter configured to receive a first voltage and generate a first current based on at least information associated with the first voltage, and a second voltage-to-current converter configured to receive a second voltage and generate a second current based on at least information associated with the second voltage. Additionally, the oscillator system further includes a current-mode N-bit digital-to-analog converter configured to receive at least the second current and a first clock signal and to generate a third current based on at least information associated with the second current and the first clock signal. N is a first integer. The first clock signal is associated with a first clock frequency corresponding to a first clock period. Moreover, the oscillator system further includes a current comparator coupled to the first voltage-to-current converter and the current-mode N-bit digital-to-analog converter.

23 Claims, 9 Drawing Sheets

FIG. 1

(Prior Art)

FIG. 2

(Prior Art)

LOW FREQUENCY OSCILLATOR FOR BURST-MODE DIMMING CONTROL FOR CCFL DRIVER SYSTEM

1. CROSS-REFERENCES TO RELATED APPLICATIONS

This application claims priority to Chinese Patent Application No. 200910053079.3, filed Jun. 12, 2009, commonly assigned, incorporated by reference herein for all purposes.

2. BACKGROUND OF THE INVENTION

The present invention is directed to oscillators. More particularly, the invention provides an oscillator that can provide a periodic signal at a low frequency with high precision. Merely by way of example, the invention has been applied to burst-mode dimming control for cold-cathode fluorescent lamp (CCFL) backlight driver system. But it would be recognized that the invention has a much broader range of applicability. For example, the present invention can be applied to integrated circuit systems other than a CCFL backlight driver system. In another example, the present invention can be applied to devices other than integrated circuits.

The burst-mode dimming control technology has been widely used in cold-cathode fluorescent lamp (CCFL) backlight driver systems to control the brightness of the CCFL. In the burst-mode dimming control, a low-frequency oscillator often is needed. To implement a low-frequency oscillator, a variety of conventional techniques have been used to generate a periodic signal at a desired frequency.

For example, conventional relaxation oscillators or multivibrators are widely used as low-frequency oscillators in monolithic integrated circuit designs. Such relaxation oscillators may be R-C charge and discharge oscillators, constant-current charge and discharge oscillators, and/or emitter-coupled multivibrators. To achieve low oscillation frequency, off-chip resistors and off-chip capacitors are usually needed.

Figure 1:
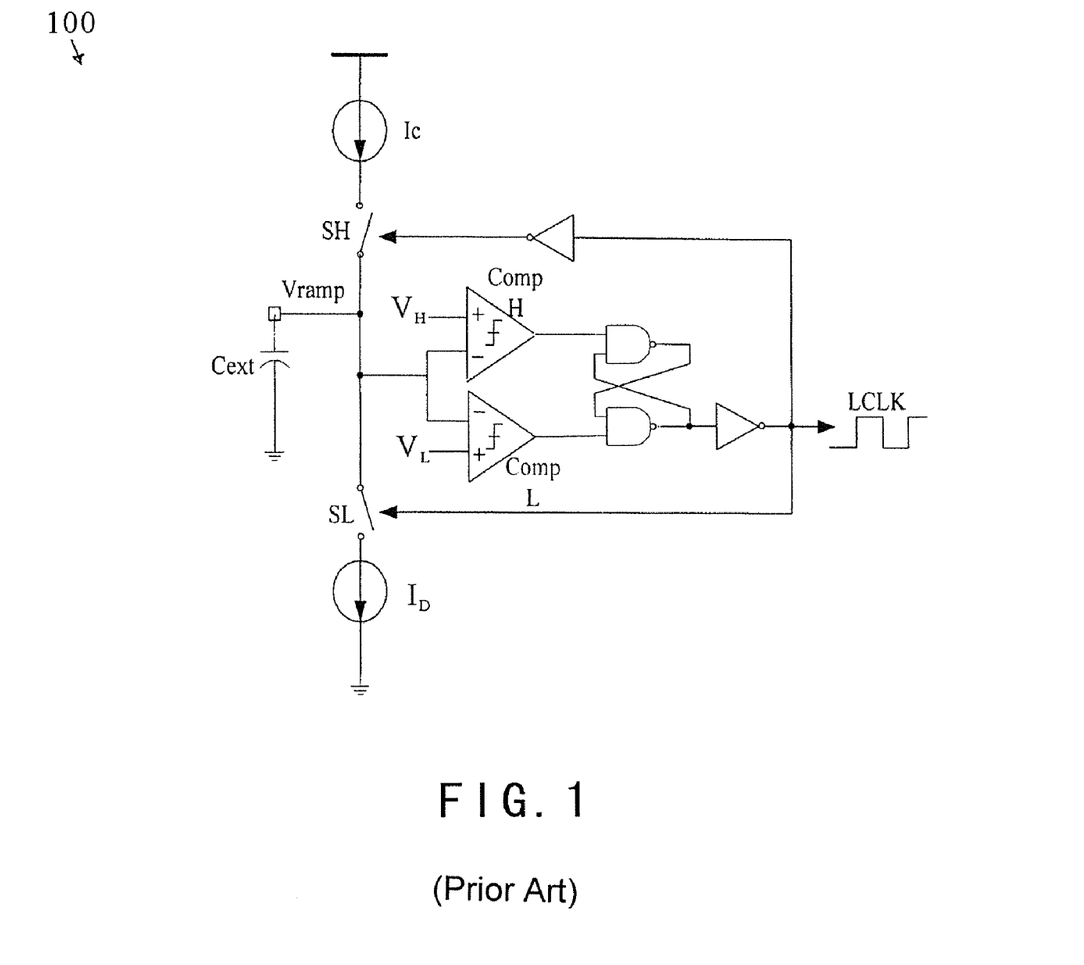
FIG. 1 is a simplified diagram showing a conventional low-frequency relaxation oscillator.

FIG. 1 is a simplified diagram showing a conventional low-frequency relaxation oscillator. The oscillator 100 operates by alternately charging and discharging an external timing capacitor $C_{ext}$ between two internally-set threshold voltage levels $V_H$ and $V_L$. Such charging and discharging result in the generation of a periodic output clock signal LCLK, whose frequency is inversely proportional to the capacitance value of the timing capacitor.

Figure 2:
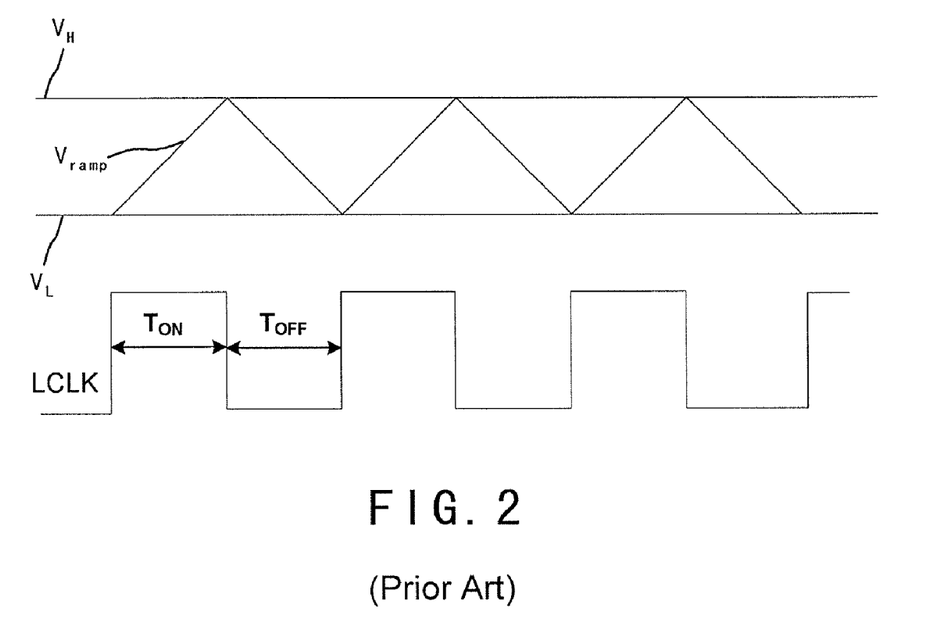
FIG. 2 is a simplified conventional diagram showing waveforms that are generated by a low-frequency relaxation oscillator.

FIG. 2 is a simplified conventional diagram showing waveforms that are generated by a low-frequency relaxation oscillator. For example, the low-frequency relaxation oscillator is the oscillator 100. In another example, the waveforms for $V_H$, $V_L$, $V_{ramp}$, and LCLK each represent the signal voltage as a function of time.

As shown in FIGS. 1 and 2, one or more external resistors often are used to form a constant current source $I_C$ and a constant current sink $I_D$. The current $I_C$ is used to charge the external timing capacitor $C_{ext}$ as follows:

$$T_{ON} = \frac{(V_H - V_L) \times C_o}{I_C} \quad \text{(Equation 1)}$$

where $T_{ON}$ is the charging time, and $C_O$ is the capacitance of the timing capacitor $C_{ext}$. Also, the current $I_D$ is used to discharge the timing capacitor $C_{ext}$ as follows:

$$T_{OFF} = \frac{(V_H - V_L) \times C_O}{I_D} \quad \text{(Equation 2)}$$

where $T_{OFF}$ is the discharging time. Hence the switching frequency $F_S$ is determined by the charging and discharging of the capacitor as follows:

$$F_S = \frac{1}{T_{ON} + T_{OFF}} = \frac{1}{(V_H - V_L)C_O} \times \frac{I_C I_D}{I_C + I_D} \quad \text{(Equation 3)}$$

But the conventional low-frequency oscillators often are costly and/or low in precision. Hence it is highly desirable to improve techniques for oscillators.

3. BRIEF SUMMARY OF THE INVENTION

The present invention is directed to oscillators. More particularly, the invention provides an oscillator that can provide a periodic signal at a low frequency with high precision. Merely by way of example, the invention has been applied to burst-mode dimming control for cold-cathode fluorescent lamp (CCFL) backlight driver system. But it would be recognized that the invention has a much broader range of applicability. For example, the present invention can be applied to integrated circuit systems other than a CCFL backlight driver system. In another example, the present invention can be applied to devices other than integrated circuits.

According to one embodiment of the present invention, an oscillator system includes a first voltage-to-current converter configured to receive a first voltage and generate a first current based on at least information associated with the first voltage, and a second voltage-to-current converter configured to receive a second voltage and generate a second current based on at least information associated with the second voltage. Additionally, the oscillator system further includes a current-mode N-bit digital-to-analog converter configured to receive at least the second current and a first clock signal and to generate a third current based on at least information associated with the second current and the first clock signal. N is a first integer. The first clock signal is associated with a first clock frequency corresponding to a first clock period. Moreover, the oscillator system further includes a current comparator coupled to the first voltage-to-current converter and the current-mode N-bit digital-to-analog converter and configured to generate a second clock signal based on at least information associated with the first current and the third current. The second clock signal is associated with a second clock frequency corresponding to a second clock period. The current comparator is further configured to determine whether the third current is equal to or larger than the first current in magnitude, and if the third current is determined to be equal to or larger than the first current in magnitude, to change the second clock signal from a first voltage level to a second voltage level in magnitude. The current-mode N-bit digital-to-analog converter is further configured to receive the second clock signal. If the second clock signal does not change from the first voltage level to the second voltage level, the third current increases in magnitude from a predetermined current level. If the second clock signal changes from the first voltage level to the second voltage level, the third current decreases in magnitude to the predetermined current level.

According to another embodiment of the present invention, an oscillator system includes a first voltage-to-current converter configured to receive a first voltage and generate a first current based on at least information associated with the first voltage, and a second voltage-to-current converter configured to receive a second voltage and generate a second current based on at least information associated with the second voltage. Additionally, the oscillator system further includes a current-mode N-bit digital-to-analog converter configured to receive at least the second current and a first clock signal and to generate a third current based on at least information associated with the second current and the first clock signal. N is a first integer. The first clock signal is associated with a first clock frequency corresponding to a first clock period. Moreover, the oscillator system further includes a current comparator coupled to the first voltage-to-current converter and the current-mode N-bit digital-to-analog converter and configured to generate a second clock signal based on at least information associated with the first current and the third current. The second clock signal is associated with a second clock frequency corresponding to a second clock period. The current comparator is further configured to determine whether the third current is equal to or larger than the first current in magnitude, and if the third current is determined to be equal to or larger than the first current in magnitude, to change the second clock signal from a first voltage level to a second voltage level in magnitude. The first voltage-to-current converter includes at least a first resistor associated with a first resistance. The first current is proportional to a first ratio between the first voltage and the first resistance. Additionally, the second voltage-to-current converter includes at least a second resistor associated with a second resistance. The second current is proportional to a second ratio between the second voltage and the second resistance.

According to yet another embodiment of the present invention, a method for generating a clock signal includes receiving a first voltage by a first voltage-to-current converter, generating a first current based on at least information associated with the first voltage, receiving a second voltage by a second voltage-to-current converter, and generating a second current based on at least information associated with the second voltage. Additionally, the method further includes receiving at least the second current and a first clock signal by a current-mode N-bit digital-to-analog converter. N is a first integer. The first clock signal is associated with a first clock frequency corresponding to a first clock period. Moreover, the method includes generating a third current based on at least information associated with the second current and the first clock signal, processing information associated with the first current and the third current by a current comparator, and generating a second clock signal based on at least information associated with the first current and the third current. The second clock signal is associated with a second clock frequency corresponding to a second clock period. The process for processing information associated with the first current and the third current includes determining whether the third current is equal to or larger than the first current in magnitude, and the process for generating a second clock signal includes if the third current is determined to be equal to or larger than the first current in magnitude, changing the second clock signal from a first voltage level to a second voltage level in magnitude. Also, the process for receiving at least the second current and a first clock signal includes receiving the second clock signal. Additionally, the process for generating a third current includes if the second clock signal does not change from the first voltage level to the second voltage level, increasing the third current in magnitude from a predetermined current level, and if the second clock signal changes from the first voltage level to the second voltage level, reducing the third current in magnitude to the predetermined current level.

Many benefits are achieved by way of the present invention over conventional techniques. Certain embodiments of the present invention provide a periodic signal of a desired frequency in integrated circuitry. For example, the periodic signal is related to the burst-mode dimming control in a CCFL backlight driver system. In another example, the periodic signal can be used for any application where a low-frequency oscillator is needed. Some embodiments of the present invention provide a high-precision low-frequency oscillator without an off-chip capacitor.

According to certain embodiments of the present invention, as the clock signal HCLK and the reference voltage signals are trimmable, the tolerance of an off-chip resistor is generally ±1%. Therefore, for the low-frequency periodic signal, satisfying the tolerance requirement of less than ±5% becomes easier to achieve in integrated circuits. Furthermore, the high-precision low-frequency clock signal can improve the burst-mode dimming control in LCD TV CCFL backlight driver systems, and make the CCFL backlight driver systems more suitable to mass production.

Depending upon embodiment, one or more of these benefits may be achieved. These benefits and various additional objects, features and advantages of the present invention can be fully appreciated with reference to the detailed description and accompanying drawings that follow.

5. DETAILED DESCRIPTION OF THE INVENTION

The present invention is directed to oscillators. More particularly, the invention provides an oscillator that can provide a periodic signal at a low frequency with high precision. Merely by way of example, the invention has been applied to burst-mode dimming control for cold-cathode fluorescent lamp (CCFL) backlight driver system. But it would be recognized that the invention has a much broader range of applicability. For example, the present invention can be applied to integrated circuit systems other than a CCFL backlight driver system. In another example, the present invention can be applied to devices other than integrated circuits.

The conventional techniques often have significant drawbacks that would adversely affect the precision of the output clock signal and the mass production of the CCFL driver system. For example, the capacitance $C_o$ of the timing capacitor $C_{ext}$ as shown in FIG. 1 may vary by as much as 20%. Such large variation can significantly contribute to the large variation of the switching frequency and hence affects the mass production of the CCFL driver system. For example, the required tolerance for burst dimming frequency in an LCD TV CCFL backlight driver system often falls within ±5%. In order to achieve such frequency precision, usually either the capacitance precision of the timing capacitor $C_{ext}$ needs to be improved, or more trimming in production is needed. The precision improvement and/or the additional trimming usually leads to higher cost. Hence there is a need for cost-effective low-frequency oscillators with high-precision.

Figure 3:
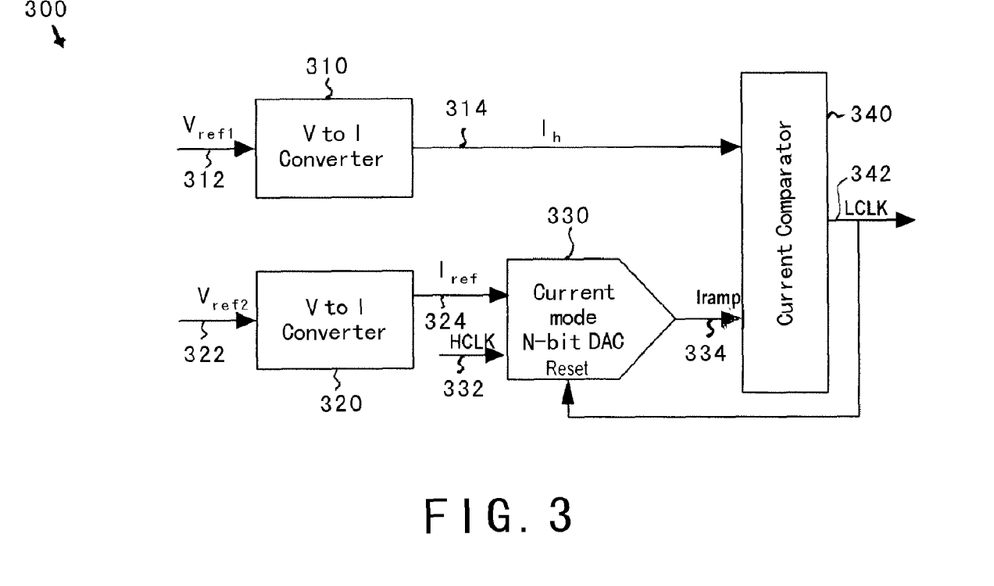
FIG. 3 is a simplified diagram showing an oscillator system according to an embodiment of the present invention.

FIG. 3 is a simplified diagram showing an oscillator system according to an embodiment of the present invention. This diagram is merely an example, which should not unduly limit the scope of the claims. One of ordinary skill in the art would recognize many variations, alternatives, and modifications. An oscillator system 300 includes voltage-to-current converters 310 and 320, a current-mode N-bit digital-to-analog converter (DAC) 330, and a current comparator 340. For example, N is a positive integer.

As shown in FIG. 3, the voltage-to-current converter 310 receives a reference voltage signal 312 and converts the voltage signal 312 to a current signal 314. For example, the reference voltage signal 312 is represented by $V_{ref1}$, and the current signal 314 is represented by $I_h$. Additionally, the voltage-to-current converter 320 receives a reference voltage signal 322 and converts the voltage signal 322 to a current signal 324. For example, the reference voltage signal 322 is represented by $V_{ref2}$, and the current signal 324 is represented by $I_{ref}$. The current signal 324 is received by the current-mode N-bit DAC 330, which also receives a signal 332. For example, the signal 332 is a clock signal HCLK with a frequency $f_{HCLK}$.

According to one embodiment, the current $I_{ref}$ is used to generate a unit current for the current-mode N-bit DAC 330. Based on the unit current, the current-mode N-bit DAC 330 generate a current signal 334 in response to the clock signal HCLK. For example, the current signal 334 is a ramp current signal $I_{ramp}$, whose magnitude increases from a minimum level within a period of time.

The current signal 334 is received by the current comparator 340, which also receives the current signal 314. The current comparator 340 processes information associated with the current signals 314 and 334, and generates a signal 342. For example, the signal 342 is a clock signal LCLK with a frequency $f_{LCLK}$. As shown in FIG. 3, the signal 342 is an output signal for the oscillator system 300. Additionally, the signal 342 is also received by the current-mode N-bit DAC 330 as a reset signal.

In one embodiment, if the current signal 334 becomes equal to or larger than the current signal 314, the clock signal LCLK makes a transition from a logic-high voltage level to a logic-low voltage level. Such transition resets the current-mode N-bit DAC 330 so that the ramp current signal $I_{ramp}$ drops back to the minimum current level.

In another embodiment, the clock signal LCLK and the clock signal HCLK are in sync. For example, the ratio between the frequency of the clock signal HCLK and the frequency of the clock signal LCLK is an integer. In another example, the phase difference between the clock signal LCLK and the clock signal HCLK is constant. In yet another embodiment, the oscillator system 300 generates the clock signal LCLK whose frequency is precisely controlled.

Figure 4:
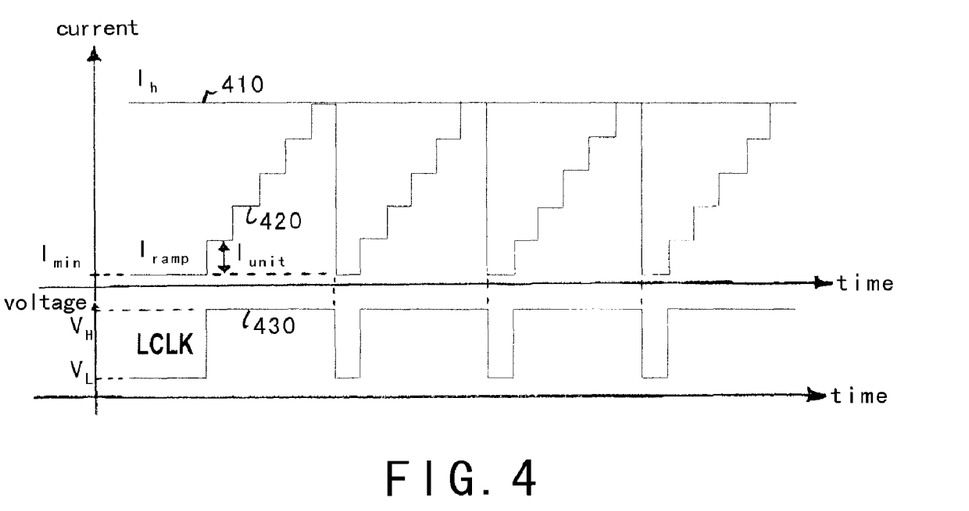
FIG. 4 is a simplified diagram showing certain signals as functions of time for an oscillator system according to an embodiment of the present invention.

FIG. 4 is a simplified diagram showing certain signals as functions of time for an oscillator system according to an embodiment of the present invention. This diagram is merely an example, which should not unduly limit the scope of the claims. One of ordinary skill in the art would recognize many variations, alternatives, and modifications. For example, the oscillator system is the oscillator system 300 as shown in FIG. 3.

As shown in FIG. 4, the waveform 410 represents the current $I_h$ as a function of time, the waveform 420 represents the current $I_{ramp}$ as a function of time, and the waveform 430 represents the voltage for the clock signal LCLK as a function of time. For example, if the current-mode N-bit digital-to-analog converter (DAC) 330 is activated, the magnitude of the ramp current signal $I_{ramp}$ increases from a minimum level $I_{min}$ on a step-by-step basis, and each step is equal to $I_{unit}$ in magnitude.

In one embodiment, if the ramp current signal $I_{ramp}$ becomes equal to or larger than the current $I_h$, the clock signal LCLK makes a transition from a logic-high voltage level $V_H$ to a logic-low voltage level $V_L$. Such transition resets the current-mode N-bit DAC 330 so that the ramp current signal $I_{ramp}$ drops back to the minimum current level $I_{min}$. Subsequently, the ramp current signal $I_{ramp}$ ramps up again in the next cycle. Consequently, the clock signal LCLK is generated. For example, the frequency of the signal LCLK is lower than the frequency of the signal HCLK.

Figure 5:
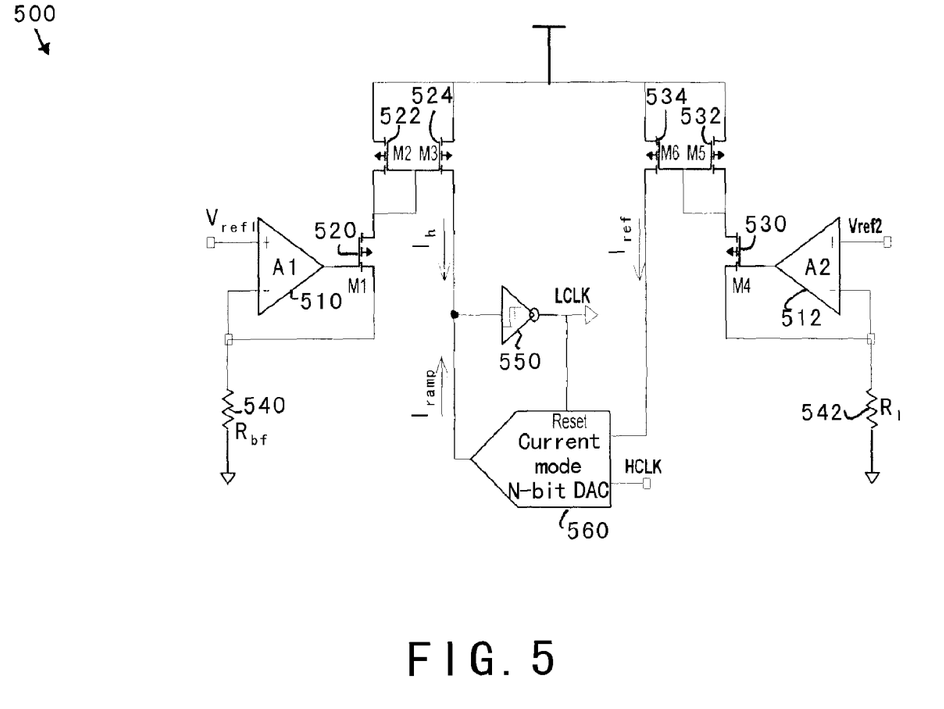
FIG. 5 is a simplified diagram showing an oscillator system according to another embodiment of the present invention.

FIG. 5 is a simplified diagram showing an oscillator system according to another embodiment of the present invention. This diagram is merely an example, which should not unduly limit the scope of the claims. One of ordinary skill in the art would recognize many variations, alternatives, and modifications. An oscillator system 500 includes operational amplifiers 510 and 512, transistors 520, 522, 524, 530, 532, and 534, resistors 540 and 542, a current comparator 550, and the current-mode N-bit digital-to-analog converter (DAC) 560. For example, N is a positive integer. In another example, the oscillator system 500 is the same as the oscillator system 300.

As shown in FIG. 5, the operational amplifier 510 receives a reference voltage signal $V_{ref1}$. The operational amplifier 510 is coupled to the resistor 540 and the transistor 520. For example, the resistor 540 is an off-chip resistor with resistance $R_{bf}$. The reference voltage signal $V_{ref1}$ is converted to a current signal by the operational amplifier 510, the resistor 540, and the transistors 520 and 522. If the current ratio of the mirror transistors 522 and 524 is 1, the current $I_h$ that flows through the transistor 524 is $$I_h = \frac{V_{ref1}}{R_{bf}} \qquad \text{(Equation 4)}$$

Hence, according to one embodiment, the voltage-to-current converter 310 includes the operational amplifier 510, transistors 520, 522, and 524, and the resistor 540. Additionally, the operational amplifier 512 receives a reference voltage signal $V_{ref2}$. The operational amplifier 512 is coupled to the resistor 542 and the transistor 530. For example, the resistor 542 is an off-chip resistor with resistance $R_f$. The reference voltage signal $V_{ref2}$ is converted to a current signal by the operational amplifier 512, the resistor 542, and the transistors 530 and 532. If the current ratio of the mirror transistors 532 and 534 is 1, the current $I_{ref}$ that flows through the transistor 534 is $$I_{ref} = \frac{V_{ref2}}{R_I} \qquad \text{(Equation 5)}$$

Hence, according to one embodiment, the voltage-to-current converter 320 includes the operational amplifier 512, transistors 530, 532, and 534, and the resistor 542.

As shown in FIG. 5, the current $I_{ref}$ is received by the current-mode N-bit digital-to-analog converter (DAC) 560, which generates a unit current $I_{unit}$ as follows:

$$I_{unit} = \frac{V_{ref2}}{2^N * R_I} \qquad \text{(Equation 6)}$$

where N is the bit number of the current-mode DAC 560. For example, N is a positive integer. In another example, the current-mode DAC 560 is the same as the current-mode DAC 330.

According to one embodiment, if the current-mode DAC 560 is activated, the magnitude of the ramp current signal $I_{ramp}$ increases from a minimum level $I_{min}$ on a step-by-step basis, and each step is equal to $I_{unit}$ in magnitude. For example, it takes K steps for the ramp current signal $I_{ramp}$ to increase from the minimum level $I_{min}$ to the level of the current $I_h$. For example, if the minimum level $I_{min}$ is equal to zero, then $$K = \frac{I_h}{I_{unit}} = \frac{2^N * R_I * V_{ref1}}{R_{bf} * V_{ref2}} \qquad \text{(Equation 7)}$$

Referring to FIG. 5, the current comparator 550 generates the clock signal LCLK. For example, the current comparator 550 is the same as the current comparator 340. In one embodiment, if the current $I_h$ is larger than the ramp current $I_{ramp}$, the clock signal LCLK is at a logic-high voltage level $V_H$, and if the current $I_h$ is equal to or lower than the ramp current $I_{ramp}$, the clock signal LCLK is at a logic-low voltage level $V_L$.

Additionally, the clock signal LCLK is sent to the current-mode N-bit DAC 560. For example, if the clock signal LCLK makes a transition from the logic-high voltage level $V_H$ to the logic-low voltage level $V_L$, such transition resets the DAC 560 so that the ramp current signal $I_{ramp}$ drops back to the minimum current level $I_{min}$. Subsequently, the ramp current signal $I_{ramp}$ ramps up again in the next cycle.

For example, $$f_{LCLK} = \frac{f_{HCLK}}{K} \qquad \text{(Equation 8)}$$

where $f_{LCLK}$ is the frequency of the clock signal LCLK, and $f_{HCLK}$ is the frequency of the clock signal HCLK. Combining equations 7 and 8, the following expression can be obtained:

$$f_{LCLK} = f_{HCLK} \frac{R_{bf} * V_{ref2}}{2^N * R_I * V_{ref1}} \qquad \text{(Equation 9)}$$

Figure 6:
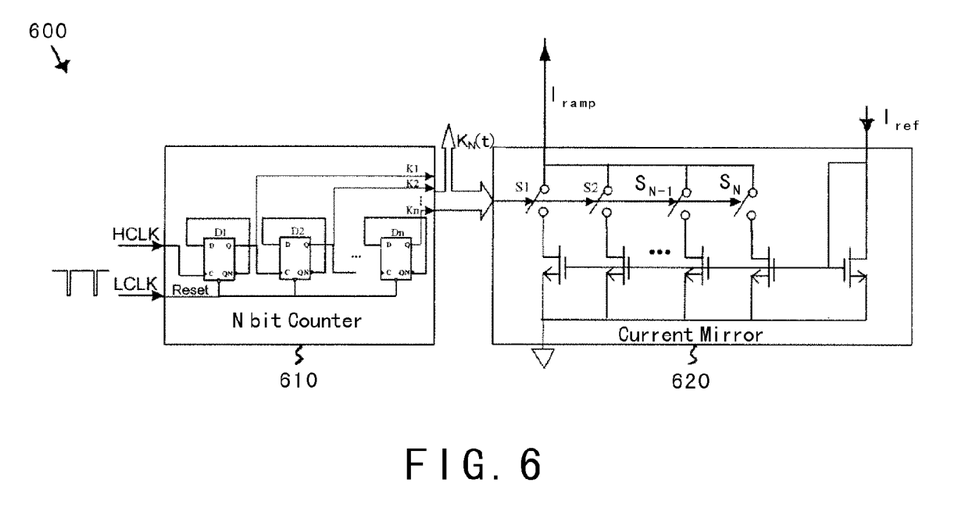
FIG. 6 is a simplified diagram showing a current-mode N-bit digital-to-analog converter (DAC) as part of an oscillator system according to an embodiment of the present invention.

FIG. 6 is a simplified diagram showing a current-mode N-bit digital-to-analog converter (DAC) as part of an oscillator system according to an embodiment of the present invention. This diagram is merely an example, which should not unduly limit the scope of the claims. One of ordinary skill in the art would recognize many variations, alternatives, and modifications. A current-mode N-bit digital-to-analog converter (DAC) 600 includes an N-bit counter 610 and a current mirror 620. For example, the current-mode N-bit digital-to-analog converter (DAC) 600 is the same as the current-mode N-bit DAC 330. In another example, the current-mode N-bit DAC 600 is the same as the current-mode N-bit DAC 560.

The N-bit counter 610 receives the clock signals HCLK and LCLK. The signal HCLK is used to trigger the N-bit counter 610, and the signal LCLK is used to reset the N-bit counter 610. The output of the N-bit counter 610 is an N-bit logical signal $K_N(t)$, which is received by the current mirror 620 and used to turn on or off switches $S_1, S_2, \ldots, S_n, \ldots, S_{N-1}$, and $S_N$. The current mirror 620 also receives the current $I_{ref}$. For example, N is a positive integer, and t represents time.

According to one embodiment, the n-th bit of the N-bit logical signal K N(t) turns on or off the switch $S_n$. n is an integer larger than 0 and smaller than N+1. According to another embodiment, by turning on or off the switches $S_1, S_2, \ldots, S_n, \ldots, S_{N-1}$, and $S_N$, the N-bit logical signal $K_N(t)$ can change the magnitude of the ramp current $I_{ramp}$. For example, upon activation of the current-mode N-bit DAC 600, the N-bit logical signal $K_N(t)$ increments by one after every period of the clock signal HCLK. The N-bit logical signal $K_N(t)$ can be reset to zero by the clock signal LCLK, or is reset to zero after the N-bit logical signal $K_N(t)$ reaches $2^N$.

Figure 7:
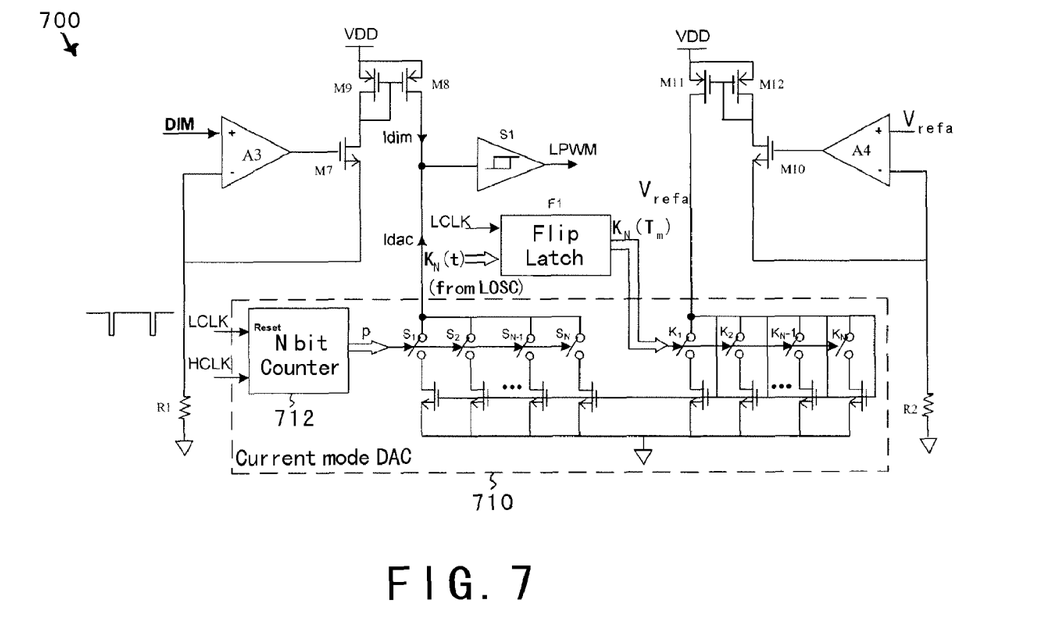
FIG. 7 is a simplified diagram showing a current-mode PWM controller according to an embodiment of the present invention.

FIG. 7 is a simplified diagram showing a current-mode PWM controller according to an embodiment of the present invention. This diagram is merely an example, which should not unduly limit the scope of the claims. One of ordinary skill in the art would recognize many variations, alternatives, and modifications.

The current-mode PWM controller 700 receives a voltage signal DIM. For example, the voltage signal DIM is from an external source. The voltage signal DIM is processed by a voltage-current converter and converted into a current signal Idim that flows through a transistor M8. In one embodiment, the voltage-current converter includes an operational amplifier A3, transistors M7, M8, and M9, and a resistor R1. If the current ratio of the mirror transistors M8 and M9 is 1, then $$Idim = \frac{Vdim}{R1} \qquad \text{(Equation 10)}$$

where Vdim is the magnitude of the voltage signal DIM. Additionally, the current-mode PWM controller 700 receives a reference voltage signal Vrefa. For example, the reference voltage signal Vrefa represents a voltage level generated by an internal source. The reference voltage signal Vrefa is processed by another voltage-current converter and converted into a current signal Irefa that flows through a transistor M11. In one embodiment, the voltage-current converter includes an operational amplifier A4, transistors M10, M11, and M12, and a resistor R2. If the current ratio of the mirror transistors M11 and M12 is 1, then $$Irefa = \frac{Vrefa}{R2} \quad \text{(Equation 11)}$$

Irefa is received by a current mode DAC 710. Moreover, the current-mode PWM controller 700 includes a flip latch F1. As shown in FIG. 7, the flip latch F1 receives a clock signal LCLK and an N-bit logical signal $K_N(t)$, and outputs an N-bit logic signal $K_N(T_m)$. $T_m$ represents the m-th period of the clock signal LCLK. For example, the clock signal LCLK is generated by the oscillator system 300 and/or the oscillator system 500. In another example, the N-bit logical signal $K_N(t)$ is generated by the current-mode N-bit DAC 600.

The N-bit logic signal $K_N(T_m)$ is received by the current mode DAC 710. The N-bit logic signal $K_N(T_m)$ is used to divide Irefa into $K_N(T_m)$ units of current, each unit of current being equal to Iunita.

$$Iunita = \frac{Irefa}{K_N(T_m)} = \frac{Vrefa}{K_N(T_m) \times R2} \quad \text{(Equation 12)}$$

As shown in FIG. 7, clock signals HCLK and LCLK are received by an N-bit counter 712, which generates an output signal p. For example, the clock signal HCLK is received by the oscillator system 300, the clock signal LCLK is generated by the oscillator system 300, and the clock signal LCLK received by the N-bit counter 712 is the same as the clock signal LCLK received by the flip latch F1. In another example, the clock signal HCLK is received by the oscillator system 500, the clock signal LCLK is generated by the oscillator system 500, and the clock signal LCLK received by the N-bit counter 712 is the same as the clock signal LCLK received by the flip latch F1.

The current mode DAC 710 generates a ramp current Idac, which increases from a minimum level on a step-by-step basis after each period of the clock signal HCLK. Each step is equal to Iunita. After each period of the clock signal LCLK, the ramp current Idac drops back to the minimum level, and the output signal p is reset to zero.

For example, if the minimum level is equal to zero, $$Idac = p \times Iunita = \frac{p \times Vrefa}{K_N(T_m) \times R2} \quad \text{(Equation 13)}$$

The magnitude of Idac is compared to the magnitude of Idim by a current comparator s1, which generates an LPWM signal. For example, the LPWM signal is used for burst-mode dimming control.

According to one embodiment, if the current Idim is larger than the ramp current Idac, the LPWM signal is at a logic-high voltage level, and if the current Idim is equal to or lower than the ramp current Idac, the LPWM signal is at a logic-low voltage level.

If Idac=I dim (Equation 14)

$$\frac{p \times Vrefa}{K_N(T_m) \times R2} = \frac{Vdim}{R1} \quad \text{(Equation 15)}$$

Assuming R1=R2 (Equation 16)

then $$Duty = \frac{p}{K_N(T_m)} = \frac{Vdim}{Vrefa} \quad \text{(Equation 17)}$$

According to one embodiment, $$K_N(T_m) = \frac{f_{HCLK}}{f_{LCLK}} \quad \text{(Equation 18)}$$

and $f_{LPWM} = f_{LCLK}$ (Equation 19)

where $f_{HCLK}$, $f_{LCLK}$, and $f_{LPWM}$ are the frequency of the clock signal HCLK, the frequency of the clock signal LCLK, and the frequency of the LPWM signal, respectively. For example, the clock signal LCLK and the LPWM signal are in sync.

Figure 8:
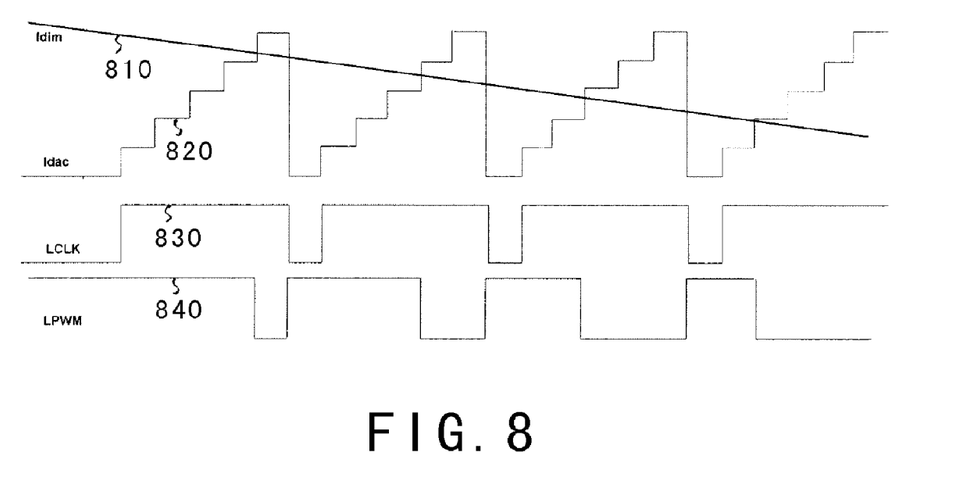
FIG. 8 is a simplified diagram showing certain signals as functions of time for a current-mode PWM controller according to an embodiment of the present invention.

FIG. 8 is a simplified diagram showing certain signals as functions of time for a current-mode PWM controller according to an embodiment of the present invention. This diagram is merely an example, which should not unduly limit the scope of the claims. One of ordinary skill in the art would recognize many variations, alternatives, and modifications. For example, the current-mode PWM controller is the current-mode PWM controller 700 as shown in FIG. 7.

As shown in FIG. 8, the waveform 810 represents the current Idim as a function of time, the waveform 820 represents the current Idac as a function of time, the waveform 830 represents the voltage for the clock signal LCLK as a function of time, and the waveform 840 represents the voltage for the LPWM signal as a function of time.

Figure 9:
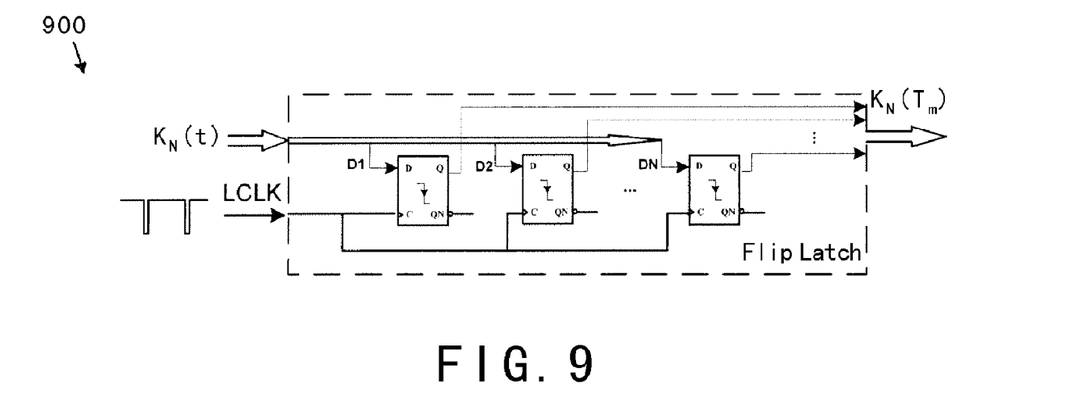
FIG. 9 is a simplified diagram showing a flip latch as part of a current-mode PWM controller according to an embodiment of the present invention.

FIG. 9 is a simplified diagram showing a flip latch as part of a current-mode PWM controller according to an embodiment of the present invention. This diagram is merely an example, which should not unduly limit the scope of the claims. One of ordinary skill in the art would recognize many variations, alternatives, and modifications. For example, the flip latch 900 is the same as the flip latch F1 as shown in FIG. 7.

As shown in FIG. 9, the flip latch 900 receives a clock signal LCLK and an N-bit logical signal $K_N(t)$, and outputs an N-bit logic signal $K_N(T_m)$. $T_m$ represents the m-th period of the clock signal LCLK. For example, the clock signal LCLK is generated by the oscillator system 300 and/or the oscillator system 500. In another example, the N-bit logical signal $K_N(t)$ is generated by the current-mode N-bit DAC 600. According to one embodiment, the flip latch 900 latches the N-bit logical signal $K_N(t)$ once every period of the clock signal LCLK. The output signal $K_N(T_m)$ remains unchanged during one period of the clock signal LCLK.

The present invention provides many advantages. Certain embodiments of the present invention provide a periodic signal of a desired frequency in integrated circuitry. For example, the periodic signal is related to the burst-mode dimming control in a CCFL backlight driver system. In another example, the periodic signal can be used for any application where a low-frequency oscillator is needed. Some embodiments of the present invention provide a high-precision low-frequency oscillator without an off-chip capacitor.

According to certain embodiments of the present invention, as the clock signal HCLK and the reference voltage signals (e.g., Vref1 and Vref2) are trimmable, the tolerance of an off-chip resistor is generally ±1%. Therefore, for the low-frequency periodic signal, satisfying the tolerance requirement of less than ±5% becomes easier to achieve in integrated circuits. Furthermore, the high-precision low-frequency clock signal can improve the burst-mode dimming control in LCD TV CCFL backlight driver systems, and make the CCFL backlight driver systems more suitable to mass production.

According to another embodiment of the present invention, an oscillator system includes a first voltage-to-current converter configured to receive a first voltage and generate a first current based on at least information associated with the first voltage, and a second voltage-to-current converter configured to receive a second voltage and generate a second current based on at least information associated with the second voltage. Additionally, the oscillator system further includes a current-mode N-bit digital-to-analog converter configured to receive at least the second current and a first clock signal and to generate a third current based on at least information associated with the second current and the first clock signal. N is a first integer. The first clock signal is associated with a first clock frequency corresponding to a first clock period. Moreover, the oscillator system further includes a current comparator coupled to the first voltage-to-current converter and the current-mode N-bit digital-to-analog converter and configured to generate a second clock signal based on at least information associated with the first current and the third current. The second clock signal is associated with a second clock frequency corresponding to a second clock period. The current comparator is further configured to determine whether the third current is equal to or larger than the first current in magnitude, and if the third current is determined to be equal to or larger than the first current in magnitude, to change the second clock signal from a first voltage level to a second voltage level in magnitude. The current-mode N-bit digital-to-analog converter is further configured to receive the second clock signal. If the second clock signal does not change from the first voltage level to the second voltage level, the third current increases in magnitude from a predetermined current level. If the second clock signal changes from the first voltage level to the second voltage level, the third current decreases in magnitude to the predetermined current level. For example, the oscillator system is implemented according to FIGS. 3, 4, 5, and/or 6.

In another example, a ratio between the first clock frequency and the second clock frequency is equal to a second integer. In yet another example, the first clock signal and the second clock signal are in sync. In yet another example, the first voltage and the second voltage are different. In yet another example, the first voltage level is a logic high level, and the second voltage level is a logic low level. In yet another example, the current-mode N-bit digital-to-analog converter is further configured to process information associated with the second current and generate a first magnitude based on at least information associated with the second current. In yet another example, if the second clock signal does not change from the first voltage level to the second voltage level, the third current increases step by step in magnitude as a function of time from the predetermined current level. A second magnitude of increase for one step is equal to the first magnitude, and a duration for the one step is equal to the second clock period. In yet another example, the current-mode N-bit digital-to-analog converter is further configured to generate an N-bit logic signal based on at least information associated with the first clock signal and the second clock signal. In yet another example, the current-mode N-bit digital-to-analog converter includes an N-bit counter configured to receive the first clock signal and the second clock signal and generate an N-bit logic signal based on at least information associated with the first clock signal and the second clock signal, and a current mirror configured to receive the N-bit logic signal and the second current and generate the third current based on at least information associated with the N-bit logic signal and the second current.

According to yet another embodiment of the present invention, an oscillator system includes a first voltage-to-current converter configured to receive a first voltage and generate a first current based on at least information associated with the first voltage, and a second voltage-to-current converter configured to receive a second voltage and generate a second current based on at least information associated with the second voltage. Additionally, the oscillator system further includes a current-mode N-bit digital-to-analog converter configured to receive at least the second current and a first clock signal and to generate a third current based on at least information associated with the second current and the first clock signal. N is a first integer. The first clock signal is associated with a first clock frequency corresponding to a first clock period. Moreover, the oscillator system further includes a current comparator coupled to the first voltage-to-current converter and the current-mode N-bit digital-to-analog converter and configured to generate a second clock signal based on at least information associated with the first current and the third current. The second clock signal is associated with a second clock frequency corresponding to a second clock period. The current comparator is further configured to determine whether the third current is equal to or larger than the first current in magnitude, and if the third current is determined to be equal to or larger than the first current in magnitude, to change the second clock signal from a first voltage level to a second voltage level in magnitude. The first voltage-to-current converter includes at least a first resistor associated with a first resistance. The first current is proportional to a first ratio between the first voltage and the first resistance. Additionally, the second voltage-to-current converter includes at least a second resistor associated with a second resistance. The second current is proportional to a second ratio between the second voltage and the second resistance. For example, the oscillator system is implemented according to FIGS. 3, 4, 5, and/or 6.

In another example, the current-mode N-bit digital-to-analog converter is further configured to receive the second clock signal. If the second clock signal does not change from the first voltage level to the second voltage level, the third current increases in magnitude from a predetermined current level, and if the second clock signal changes from the first voltage level to the second voltage level, the third current decreases in magnitude to the predetermined current level. In yet another example, a third ratio between the first clock frequency and the second clock frequency is equal to a second integer. In yet another example, the first clock signal and the second clock signal are in sync. In yet another example, the current-mode N-bit digital-to-analog converter is further configured to process information associated with the second current and generate a first magnitude based on at least information associated with the second current. In yet another example, if the second clock signal does not change from the first voltage level to the second voltage level, the third current increases step by step in magnitude as a function of time from the predetermined current level. A second magnitude of increase for one step is equal to the first magnitude, and a duration for the one step is equal to the second clock period. In yet another example, the current-mode N-bit digital-to-analog converter is further configured to generate an N-bit logic signal based on at least information associated with the first clock signal and the second clock signal.

According to yet another embodiment of the present invention, a method for generating a clock signal includes receiving a first voltage by a first voltage-to-current converter, generating a first current based on at least information associated with the first voltage, receiving a second voltage by a second voltage-to-current converter, and generating a second current based on at least information associated with the second voltage. Additionally, the method further includes receiving at least the second current and a first clock signal by a current-mode N-bit digital-to-analog converter. N is a first integer. The first clock signal is associated with a first clock frequency corresponding to a first clock period. Moreover, the method includes generating a third current based on at least information associated with the second current and the first clock signal, processing information associated with the first current and the third current by a current comparator, and generating a second clock signal based on at least information associated with the first current and the third current. The second clock signal is associated with a second clock frequency corresponding to a second clock period. The process for processing information associated with the first current and the third current includes determining whether the third current is equal to or larger than the first current in magnitude, and the process for generating a second clock signal includes if the third current is determined to be equal to or larger than the first current in magnitude, changing the second clock signal from a first voltage level to a second voltage level in magnitude. Also, the process for receiving at least the second current and a first clock signal includes receiving the second clock signal. Additionally, the process for generating a third current includes if the second clock signal does not change from the first voltage level to the second voltage level, increasing the third current in magnitude from a predetermined current level, and if the second clock signal changes from the first voltage level to the second voltage level, reducing the third current in magnitude to the predetermined current level. For example, the method for generating a clock signal is implemented according to FIGS. 3, 4, 5, and/or 6.

In another example, a ratio between the first clock frequency and the second clock frequency is equal to a second integer. In yet another example, the first clock signal and the second clock signal are in sync. In yet another example, the first voltage level is a logic high level, and the second voltage level is a logic low level. In yet another example, the process for generating a third current includes generating a first magnitude based on at least information associated with the second current. In yet another example, the process for generating a third current further includes if the second clock signal does not change from the first voltage level to the second voltage level, increasing the third current in magnitude step by step as a function of time from the predetermined current level. A second magnitude of increase for one step is equal to the first magnitude, and a duration of the one step is equal to the second clock period. In yet another example, the method for generating a clock signal further includes generating, by the current-mode N-bit digital-to-analog converter, an N-bit logic signal based on at least information associated with the first clock signal and the second clock signal.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. An oscillator system, the system comprising:
a first voltage-to-current converter configured to receive a first voltage and generate a first current based on at least information associated with the first voltage;
a second voltage-to-current converter configured to receive a second voltage and generate a second current based on at least information associated with the second voltage;
a current-mode N-bit digital-to-analog converter configured to receive at least the second current and a first clock signal and to generate a third current based on at least information associated with the second current and the first clock signal, N being a first integer, the first clock signal being associated with a first clock frequency corresponding to a first clock period; and
a current comparator coupled to the first voltage-to-current converter and the current-mode N-bit digital-to-analog converter and configured to generate a second clock signal based on at least information associated with the first current and the third current, the second clock signal being associated with a second clock frequency corresponding to a second clock period;
wherein the current comparator is further configured to:
 determine whether the third current is equal to or larger than the first current in magnitude; and
 if the third current is determined to be equal to or larger than the first current in magnitude, change the second clock signal from a first voltage level to a second voltage level in magnitude;
wherein:
 the current-mode N-bit digital-to-analog converter is further configured to receive the second clock signal;
 if the second clock signal does not change from the first voltage level to the second voltage level, the third current increases in magnitude from a predetermined current level; and
 if the second clock signal changes from the first voltage level to the second voltage level, the third current decreases in magnitude to the predetermined current level.

2. The oscillator system of claim 1 wherein a ratio between the first clock frequency and the second clock frequency is equal to a second integer.

3. The oscillator system of claim 1 wherein the first clock signal and the second clock signal are in sync.

4. The oscillator system of claim 1 wherein the first voltage and the second voltage are different.

5. The oscillator system of claim 1 wherein:
the first voltage level is a logic high level; and
the second voltage level is a logic low level.

6. The oscillator system of claim 1 wherein the current-mode N-bit digital-to-analog converter is further configured to process information associated with the second current and generate a first magnitude based on at least information associated with the second current.

7. The oscillator system of claim 6 wherein:
if the second clock signal does not change from the first voltage level to the second voltage level, the third current increases step by step in magnitude as a function of time from the predetermined current level;
a second magnitude of increase for one step is equal to the first magnitude; and
a duration for the one step is equal to the second clock period.

8. The oscillator system of claim 1 wherein the current-mode N-bit digital-to-analog converter is further configured to generate an N-bit logic signal based on at least information associated with the first clock signal and the second clock signal.

9. The oscillator system of claim 1 wherein the current-mode N-bit digital-to-analog converter includes:
   an N-bit counter configured to receive the first clock signal and the second clock signal and generate an N-bit logic signal based on at least information associated with the first clock signal and the second clock signal; and
   a current mirror configured to receive the N-bit logic signal and the second current and generate the third current based on at least information associated with the N-bit logic signal and the second current.

10. An oscillator system, the system comprising:
   a first voltage-to-current converter configured to receive a first voltage and generate a first current based on at least information associated with the first voltage;
   a second voltage-to-current converter configured to receive a second voltage and generate a second current based on at least information associated with the second voltage;
   a current-mode N-bit digital-to-analog converter configured to receive at least the second current and a first clock signal and to generate a third current based on at least information associated with the second current and the first clock signal, N being a first integer, the first clock signal being associated with a first clock frequency corresponding to a first clock period; and
   a current comparator coupled to the first voltage-to-current converter and the current-mode N-bit digital-to-analog converter and configured to generate a second clock signal based on at least information associated with the first current and the third current, the second clock signal being associated with a second clock frequency corresponding to a second clock period;
   wherein the current comparator is further configured to:
      determine whether the third current is equal to or larger than the first current in magnitude; and
      if the third current is determined to be equal to or larger than the first current in magnitude, change the second clock signal from a first voltage level to a second voltage level in magnitude;
   wherein:
      the first voltage-to-current converter includes at least a first resistor associated with a first resistance, the first current being proportional to a first ratio between the first voltage and the first resistance; and
      the second voltage-to-current converter includes at least a second resistor associated with a second resistance, the second current being proportional to a second ratio between the second voltage and the second resistance.

11. The oscillator system of claim 10 wherein:
   the current-mode N-bit digital-to-analog converter is further configured to receive the second clock signal;
   if the second clock signal does not change from the first voltage level to the second voltage level, the third current increases in magnitude from a predetermined current level; and
   if the second clock signal changes from the first voltage level to the second voltage level, the third current decreases in magnitude to the predetermined current level.

12. The oscillator system of claim 10 wherein a third ratio between the first clock frequency and the second clock frequency is equal to a second integer.

13. The oscillator system of claim 10 wherein the first clock signal and the second clock signal are in sync.

14. The oscillator system of claim 10 wherein the current-mode N-bit digital-to-analog converter is further configured to process information associated with the second current and generate a first magnitude based on at least information associated with the second current.

15. The oscillator system of claim 14 wherein:
   if the second clock signal does not change from the first voltage level to the second voltage level, the third current increases step by step in magnitude as a function of time from the predetermined current level;
   a second magnitude of increase for one step is equal to the first magnitude; and
   a duration for the one step is equal to the second clock period.

16. The oscillator system of claim 10 wherein the current-mode N-bit digital-to-analog converter is further configured to generate an N-bit logic signal based on at least information associated with the first clock signal and the second clock signal.

17. A method for generating a clock signal, the method comprising:
   receiving a first voltage by a first voltage-to-current converter;
   generating a first current based on at least information associated with the first voltage;
   receiving a second voltage by a second voltage-to-current converter;
   generating a second current based on at least information associated with the second voltage;
   receiving at least the second current and a first clock signal by a current-mode N-bit digital-to-analog converter, N being a first integer, the first clock signal being associated with a first clock frequency corresponding to a first clock period;
   generating a third current based on at least information associated with the second current and the first clock signal;
   processing information associated with the first current and the third current by a current comparator; and
   generating a second clock signal based on at least information associated with the first current and the third current, the second clock signal being associated with a second clock frequency corresponding to a second clock period;
   wherein:
      the process for processing information associated with the first current and the third current includes determining whether the third current is equal to or larger than the first current in magnitude;
      the process for generating a second clock signal includes if the third current is determined to be equal to or larger than the first current in magnitude, changing the second clock signal from a first voltage level to a second voltage level in magnitude;
      the process for receiving at least the second current and a first clock signal includes receiving the second clock signal; and
      the process for generating a third current includes:
         if the second clock signal does not change from the first voltage level to the second voltage level, increasing the third current in magnitude from a predetermined current level; and
         if the second clock signal changes from the first voltage level to the second voltage level, reducing the third current in magnitude to the predetermined current level.

18. The method of claim 17 wherein a ratio between the first clock frequency and the second clock frequency is equal to a second integer.

19. The method of claim 17 wherein the first clock signal and the second clock signal are in sync.

20. The method of claim 17 wherein:
the first voltage level is a logic high level; and
the second voltage level is a logic low level.

21. The method of claim 17, wherein the process for generating a third current includes generating a first magnitude based on at least information associated with the second current.

22. The method of claim 21 wherein the process for generating a third current further includes:

if the second clock signal does not change from the first voltage level to the second voltage level, increasing the third current in magnitude step by step as a function of time from the predetermined current level;
a second magnitude of increase for one step is equal to the first magnitude; and
a duration of the one step is equal to the second clock period.

23. The method of claim 17, and further comprising generating, by the current-mode N-bit digital-to-analog converter, an N-bit logic signal based on at least information associated with the first clock signal and the second clock signal.

* * * * *